US009761775B2

(12) United States Patent
Cao

(10) Patent No.: US 9,761,775 B2
(45) Date of Patent: *Sep. 12, 2017

(54) SEMICONDUCTOR LIGHT SOURCE

(71) Applicant: EPISTAR CORPORATION, Hsinchu (TW)

(72) Inventor: Densen Cao, Sandy, UT (US)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/867,943

(22) Filed: Apr. 22, 2013

(65) Prior Publication Data

US 2013/0234174 A1 Sep. 12, 2013

Related U.S. Application Data

(63) Continuation of application No. 12/785,203, filed on May 21, 2010, now Pat. No. 8,723,212, which is a continuation of application No. 11/397,323, filed on Apr. 4, 2006, now Pat. No. 7,728,345, which is a continuation-in-part of application No. 10/773,123, filed on Feb. 5, 2004, now abandoned, which is a continuation-in-part of application No. 09/939,339, filed on Aug. 24, 2001, now Pat. No. 7,224,001.

(51) Int. Cl.
| | |
|---|---|
| *H01L 33/64* | (2010.01) |
| *F21K 9/232* | (2016.01) |
| *H01L 25/075* | (2006.01) |
| *H01L 33/48* | (2010.01) |
| *H01L 33/62* | (2010.01) |
| *F21V 3/02* | (2006.01) |
| *F21Y 115/10* | (2016.01) |
| *F21Y 107/30* | (2016.01) |

(52) U.S. Cl.
CPC .............. *H01L 33/64* (2013.01); *F21K 9/232* (2016.08); *F21V 3/02* (2013.01); *F21Y 2107/30* (2016.08); *F21Y 2115/10* (2016.08); *H01L 25/0753* (2013.01); *H01L 33/486* (2013.01); *H01L 33/62* (2013.01); *H01L 2224/45124* (2013.01); *H01L 2224/48091* (2013.01); *H01L 2224/73265* (2013.01); *H01L 2924/01004* (2013.01); *H01L 2924/01078* (2013.01); *H01L 2924/01079* (2013.01); *H01L 2924/12041* (2013.01)

(58) Field of Classification Search
CPC ...................................................... H01L 33/486
See application file for complete search history.

(56) References Cited

U.S. PATENT DOCUMENTS

| | | |
|---|---|---|
| 1,151,377 A | 8/1915 | Nash |
| 4,240,090 A | 12/1980 | Hughes |
| 4,394,679 A * | 7/1983 | Hawrylo .......................... 257/99 |
| 4,674,011 A | 6/1987 | Patton |

(Continued)

*Primary Examiner* — Jerome Jackson, Jr.
(74) *Attorney, Agent, or Firm* — Ditthavong & Steiner, P.C.

(57) ABSTRACT

A light source may comprise a thermally conductive frame comprising a base and a faceted portion extending from the base. The faceted portion may comprise a plurality of facets spaced circumferentially thereabout. Additionally, a hollow passageway may extend through the base and axially through the faceted portion. A plurality of LED chips may be arranged on the plurality of facets to provide an emission of light in an arc of 360 degrees.

13 Claims, 8 Drawing Sheets

(56) References Cited

U.S. PATENT DOCUMENTS

| | | |
|---|---|---|
| 4,675,575 A | 6/1987 | Smith |
| 4,727,289 A | 2/1988 | Uchida |
| 5,055,892 A | 10/1991 | Gardner |
| 5,160,200 A | 11/1992 | Cheselske |
| 5,174,646 A | 12/1992 | Siminovitch |
| 5,349,599 A | 9/1994 | Larkins |
| 5,414,281 A | 5/1995 | Watabe |
| 5,463,280 A | 10/1995 | Johnson |
| 5,535,230 A | 7/1996 | Abe |
| 5,575,459 A | 11/1996 | Anderson |
| 5,595,438 A | 1/1997 | Burd |
| 5,655,830 A | 8/1997 | Ruskouski |
| 5,688,042 A | 11/1997 | Madadi |
| 5,707,139 A | 1/1998 | Haitz |
| 5,721,430 A | 2/1998 | Wong |
| 5,758,951 A | 6/1998 | Haitz |
| 5,765,940 A | 6/1998 | Levy |
| 5,803,579 A | 9/1998 | Turnbull |
| 5,806,965 A * | 9/1998 | Deese ............ 362/249.04 |
| 5,813,752 A | 9/1998 | Singer |
| 5,890,794 A | 4/1999 | Abtahi |
| 5,941,626 A | 8/1999 | Yamuro |
| 5,941,631 A | 8/1999 | Hsu |
| 5,947,588 A | 9/1999 | Huang |
| 5,982,092 A | 11/1999 | Chen |
| 6,015,979 A | 1/2000 | Sugiura |
| 6,045,240 A | 4/2000 | Hochstein |
| 6,149,283 A | 11/2000 | Conway |
| 6,220,722 B1 | 4/2001 | Begemann |
| 6,238,077 B1 | 5/2001 | Ramer |
| 6,331,111 B1 | 12/2001 | Cao |
| 6,355,946 B1 | 3/2002 | Ishinaga |
| 6,357,889 B1 | 3/2002 | Duggal |
| 6,402,338 B1 | 6/2002 | Mitzel |
| 6,412,971 B1 | 7/2002 | Wojnarowski |
| 6,465,961 B1 | 10/2002 | Cao |
| 6,478,453 B2 | 11/2002 | Lammers |
| 6,498,108 B2 | 12/2002 | Cao et al. |
| 6,499,860 B2 | 12/2002 | Begemann |
| 6,502,952 B1 | 1/2003 | Hartley |
| 6,504,180 B1 | 1/2003 | Heremans |
| 6,541,800 B2 | 4/2003 | Barnett |
| 6,561,680 B1 | 5/2003 | Shih |
| 6,577,073 B2 | 6/2003 | Shimizu |
| 6,580,228 B1 | 6/2003 | Chen |
| 6,601,962 B1 | 8/2003 | Ehara |
| 6,634,770 B2 | 10/2003 | Cao |
| 6,634,771 B2 | 10/2003 | Cao |
| 6,635,987 B1 * | 10/2003 | Wojnarowski et al. ...... 313/498 |
| 6,700,158 B1 | 3/2004 | Cao et al. |
| 6,709,132 B2 | 3/2004 | Ishibashi |
| 6,715,900 B2 * | 4/2004 | Zhang ............ 362/294 |
| 6,719,446 B2 | 4/2004 | Cao |
| 6,719,558 B2 | 4/2004 | Cao |
| 6,719,559 B2 | 4/2004 | Cao |
| 6,746,885 B2 | 6/2004 | Cao |
| 6,755,648 B2 | 6/2004 | Cao |
| 6,755,649 B2 | 6/2004 | Cao |
| 6,780,010 B2 | 8/2004 | Cao |
| 6,783,362 B2 | 8/2004 | Cao |
| 6,786,625 B2 | 9/2004 | Wesson |
| 6,799,967 B2 | 10/2004 | Cao |
| 6,815,241 B2 | 11/2004 | Wang |
| 6,824,294 B2 | 11/2004 | Cao |
| 6,840,654 B2 | 1/2005 | Guerrieri |
| 6,903,380 B2 | 6/2005 | Barnett |
| 6,910,886 B2 | 6/2005 | Cao |
| 6,926,524 B2 | 8/2005 | Cao |
| 6,929,472 B2 | 8/2005 | Cao |
| 6,932,600 B2 | 8/2005 | Cao |
| 6,948,829 B2 | 9/2005 | Verdes |
| 6,953,340 B2 | 10/2005 | Cao |
| 6,954,270 B2 | 10/2005 | Ostler et al. |
| 6,955,537 B2 | 10/2005 | Cao |
| 6,969,253 B2 | 11/2005 | Cao |
| 6,971,875 B2 | 12/2005 | Cao |
| 6,971,876 B2 | 12/2005 | Cao |
| 6,974,233 B1 | 12/2005 | Aubrey |
| 6,974,319 B2 | 12/2005 | Cao |
| 6,979,193 B2 | 12/2005 | Cao |
| 6,979,194 B2 | 12/2005 | Cao |
| 6,981,867 B2 | 1/2006 | Cao |
| 6,982,518 B2 | 1/2006 | Chou |
| 6,988,890 B2 | 1/2006 | Cao |
| 6,988,891 B2 | 1/2006 | Cao |
| 7,066,732 B2 | 6/2006 | Cao |
| 7,077,648 B2 | 7/2006 | Cao |
| 7,086,858 B2 | 8/2006 | Cao |
| 7,094,054 B2 | 8/2006 | Cao |
| 7,108,504 B2 | 9/2006 | Cao |
| 7,128,454 B2 | 10/2006 | Kim |
| 7,150,553 B2 | 12/2006 | English |
| 7,196,358 B1 | 3/2007 | Chen |
| 7,224,001 B2 | 5/2007 | Cao |
| 7,252,678 B2 | 8/2007 | Ostler et al. |
| 7,267,457 B2 | 9/2007 | Ostler et al. |
| 7,271,420 B2 | 9/2007 | Cao |
| 7,283,230 B2 | 10/2007 | Ostler et al. |
| 7,294,364 B2 | 11/2007 | Cao |
| 7,485,116 B2 | 2/2009 | Cao |
| 7,490,959 B2 | 2/2009 | Tsuda |
| 7,530,808 B2 | 5/2009 | Cao et al. |
| 7,588,351 B2 | 9/2009 | Meyer |
| 7,645,086 B2 | 1/2010 | Zhang et al. |
| 7,726,858 B2 | 6/2010 | Sato |
| 7,728,345 B2 | 6/2010 | Cao |
| 7,786,499 B2 | 8/2010 | Cao |
| 7,976,211 B2 | 7/2011 | Cao |
| 8,201,985 B2 | 6/2012 | Cao |
| 8,220,115 B2 | 7/2012 | Nichols et al. |
| 8,337,097 B2 | 12/2012 | Cao |
| 2002/0111023 A1 | 8/2002 | Cao et al. |
| 2002/0113244 A1 | 8/2002 | Barnett |
| 2002/0115037 A1 | 8/2002 | Cao |
| 2002/0163317 A1 | 11/2002 | Cao |
| 2002/0167283 A1 | 11/2002 | Cao |
| 2002/0168603 A1 | 11/2002 | Cao |
| 2002/0168604 A1 | 11/2002 | Cao |
| 2002/0168605 A1 | 11/2002 | Cao |
| 2002/0168606 A1 | 11/2002 | Cao |
| 2002/0168607 A1 | 11/2002 | Cao |
| 2002/0168608 A1 | 11/2002 | Cao |
| 2002/0172912 A1 | 11/2002 | Cao |
| 2002/0172913 A1 | 11/2002 | Cao |
| 2002/0172914 A1 | 11/2002 | Cao |
| 2002/0172915 A1 | 11/2002 | Cao |
| 2002/0172916 A1 | 11/2002 | Cao |
| 2002/0172917 A1 | 11/2002 | Cao |
| 2002/0175352 A1 | 11/2002 | Cao |
| 2002/0175628 A1 | 11/2002 | Cao |
| 2002/0177095 A1 | 11/2002 | Cao |
| 2002/0177096 A1 | 11/2002 | Cao |
| 2002/0177099 A1 | 11/2002 | Cao |
| 2002/0180368 A1 | 12/2002 | Cao |
| 2002/0181947 A1 | 12/2002 | Cao |
| 2002/0182561 A1 | 12/2002 | Cao |
| 2002/0182562 A1 | 12/2002 | Cao |
| 2002/0190659 A1 | 12/2002 | Cao |
| 2002/0190660 A1 | 12/2002 | Cao |
| 2002/0197582 A1 | 12/2002 | Cao |
| 2003/0001507 A1 | 1/2003 | Cao |
| 2003/0031032 A1 | 2/2003 | Wu |
| 2003/0038291 A1 | 2/2003 | Cao |
| 2003/0039119 A1 | 2/2003 | Cao |
| 2003/0039120 A1 | 2/2003 | Cao |
| 2003/0039122 A1 | 2/2003 | Cao |
| 2003/0040200 A1 | 2/2003 | Cao |
| 2003/0060013 A1 | 3/2003 | Marchant et al. |
| 2003/0117797 A1 | 6/2003 | Sommers |
| 2003/0133298 A1 | 7/2003 | Cao |
| 2003/0151376 A9 | 8/2003 | Cao |
| 2003/0219693 A1 | 11/2003 | Cao |
| 2004/0095738 A1 * | 5/2004 | Juang ............ 361/815 |
| 2004/0119975 A1 | 6/2004 | Ostler et al. |

(56) References Cited

U.S. PATENT DOCUMENTS

| | | |
|---|---|---|
| 2004/0120146 A1 | 6/2004 | Ostler et al. |
| 2004/0120151 A1 | 6/2004 | Ostler et al. |
| 2004/0201025 A1 | 10/2004 | Barnett |
| 2004/0256630 A1 | 12/2004 | Cao |
| 2004/0264196 A1 | 12/2004 | Shu |
| 2005/0002975 A1 | 1/2005 | Cao |
| 2005/0007772 A1 | 1/2005 | Yen |
| 2005/0074723 A1 | 4/2005 | Ostler et al. |
| 2005/0174753 A1 | 8/2005 | Cao et al. |
| 2005/0174780 A1 | 8/2005 | Park |
| 2005/0174801 A1 | 8/2005 | Cao |
| 2005/0194607 A1 | 9/2005 | Barnett |
| 2005/0202365 A1 | 9/2005 | Cao et al. |
| 2005/0231965 A1 | 10/2005 | Ostler et al. |
| 2005/0231966 A1 | 10/2005 | Ostler et al. |
| 2005/0243550 A1 | 11/2005 | Stekelenburg |
| 2005/0254246 A1 | 11/2005 | Huang |
| 2006/0027820 A1 | 2/2006 | Cao |
| 2006/0064080 A1 | 3/2006 | Cao |
| 2006/0092637 A1 | 5/2006 | Yeh |
| 2006/0095095 A1 | 5/2006 | Cao |
| 2006/0138440 A1 | 6/2006 | Jyo |
| 2006/0214179 A1 | 9/2006 | Cao |
| 2006/0232974 A1 | 10/2006 | Lee |
| 2006/0245176 A1 | 11/2006 | Ostler et al. |
| 2006/0271068 A1 | 11/2006 | Cao |
| 2006/0274529 A1 | 12/2006 | Cao |
| 2006/0275732 A1 | 12/2006 | Cao |
| 2006/0275733 A1 | 12/2006 | Cao |
| 2007/0159828 A1* | 7/2007 | Wang ............... F21K 9/135 362/294 |
| 2007/0170444 A1 | 7/2007 | Cao |
| 2007/0195527 A1* | 8/2007 | Russell ............... F21S 8/06 362/240 |
| 2007/0225658 A1 | 9/2007 | Jensen et al. |
| 2007/0236935 A1 | 10/2007 | Wang |
| 2007/0253202 A1 | 11/2007 | Wu |
| 2007/0265607 A1 | 11/2007 | Cao et al. |
| 2008/0062703 A1 | 3/2008 | Cao |
| 2008/0071256 A1 | 3/2008 | Cao et al. |
| 2008/0080184 A1 | 4/2008 | Cao |
| 2008/0086117 A1 | 4/2008 | Cao |
| 2008/0105886 A1 | 5/2008 | Borner |
| 2008/0111150 A1 | 5/2008 | Cao |
| 2008/0140030 A1 | 6/2008 | Zhang et al. |
| 2008/0154249 A1 | 6/2008 | Cao |
| 2008/0161783 A1 | 7/2008 | Cao |
| 2008/0197374 A1 | 8/2008 | Sung |
| 2008/0311545 A1 | 12/2008 | Ostler et al. |
| 2009/0011385 A1 | 1/2009 | Jensen et al. |
| 2009/0087393 A1 | 4/2009 | Jensen et al. |
| 2009/0092947 A1 | 4/2009 | Cao et al. |
| 2009/0155740 A1 | 6/2009 | Jensen et al. |
| 2009/0227875 A1 | 9/2009 | Cao et al. |
| 2009/0238779 A1 | 9/2009 | Jensen et al. |
| 2010/0004640 A1 | 1/2010 | Cao et al. |
| 2010/0096643 A1 | 4/2010 | Cao |
| 2010/0117560 A1 | 5/2010 | Cao |
| 2010/0173267 A1 | 7/2010 | Cao et al. |
| 2010/0207502 A1 | 8/2010 | Cao et al. |
| 2010/0216089 A1 | 8/2010 | Cao |
| 2010/0224905 A1 | 9/2010 | Cao |
| 2010/0251522 A1 | 10/2010 | Nichols et al. |
| 2010/0254657 A1 | 10/2010 | Cao et al. |
| 2011/0068019 A1 | 3/2011 | Jensen et al. |
| 2011/0068020 A1 | 3/2011 | Jensen et al. |
| 2011/0111373 A1 | 5/2011 | Jensen et al. |
| 2011/0234082 A1 | 9/2011 | Cao |
| 2011/0236322 A1 | 9/2011 | Jensen et al. |
| 2012/0107767 A1 | 5/2012 | Jensen et al. |
| 2012/0224395 A1 | 9/2012 | Cao |

* cited by examiner 2 or 3 facets 3 or 4 facet 4 facets 5 facets 6 facets 8 facets

SEMICONDUCTOR LIGHT SOURCE

CROSS-REFERENCE TO RELATED APPLICATIONS

This patent application is a continuation of U.S. patent application Ser. No. 12/785,203, filed May 21, 2010, which is a continuation of U.S. patent application Ser. No. 11/397,323, filed Apr. 4, 2006, now U.S. Pat. No. 7,728,345, which is a continuation-in-part of U.S. patent application Ser. No. 10/773,123, filed on Feb. 5, 2004, now abandoned, which is a continuation-in-part of U.S. patent application Ser. No. 09/939,339, filed on Aug. 24, 2001, now U.S. Pat. No. 7,224,001, the disclosures of each of which are incorporated herein by reference.

TECHNICAL FIELD

The present invention relates to the field of light sources for illuminating physical spaces and, more particularly, to light sources comprising one or more semiconducting light emitting diodes (LEDs).

BACKGROUND

This disclosure pertains to light sources, such as light bulbs, for illuminating physical spaces. In particular, the difficulty of generating sufficient light with a light emitting diode (LED) light source to illuminate a physical space is addressed. In the past, LED lights were often restricted to serving as accent lighting due to insufficient light output.

SUMMARY

A 3-dimensional multiple-faced lead frame is used to create a compact and efficient light source.

DETAILED DESCRIPTION

There are several ways to increase LED output. One is to increase the size of the chips. Another is to utilize more chips in the light source. Increasing chip size creates several issues. First, it increases cost because production processes must be more precise as chip size increases. Second, the chip will have a lower emitting efficiency due to heat issues. When an LED chip is enlarged, heat is also proportionally increased. Large amount of heat are not easily removed from the chip, therefore, the overall temperature of the chip will be increased and light emitting efficiency will decrease.

In the prior art, multiple LED chips were integrated together in 2 dimensional plate form to achieve an increase in power. Integration of multiple chips in a 2 dimensional array also has disadvantages of a large footprint and a complicated production process. This disclosure relates to structures and processes for creating an LED light source using a 3-dimensional multiple facet lead frame to create a compact and efficient light source.

Figure 1:
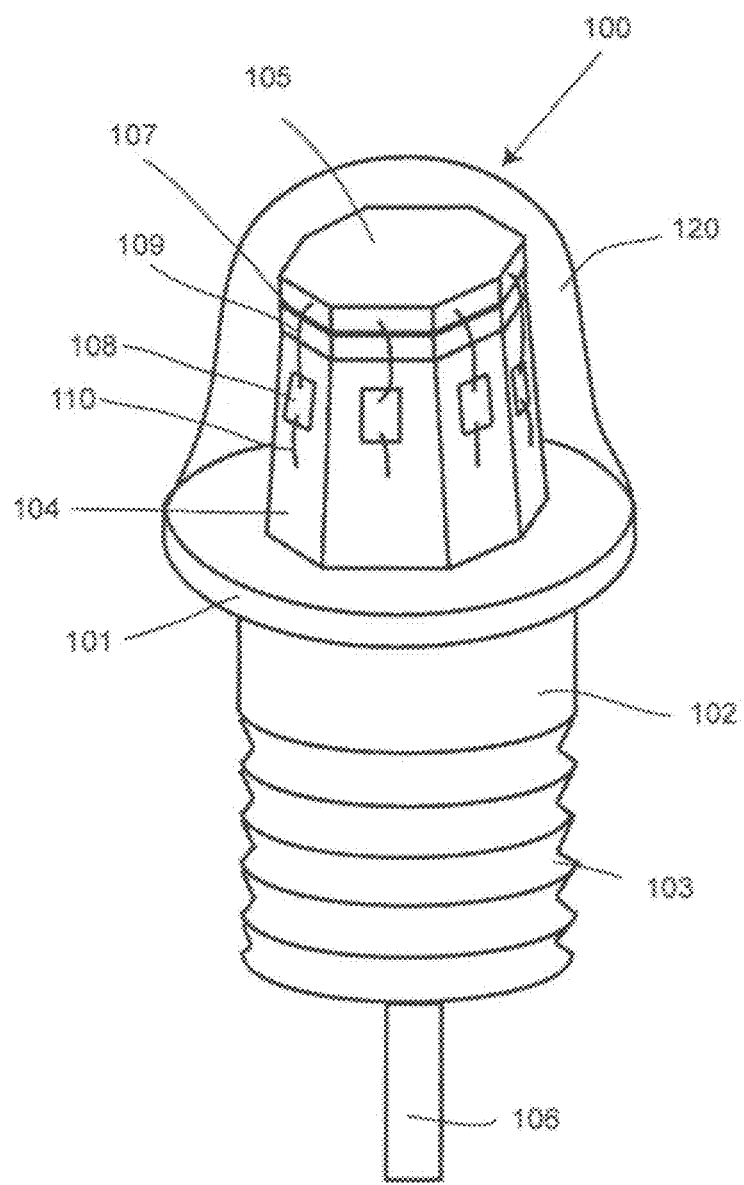
FIG. 1 depicts a perspective view of a light source for illuminating a physical space using a 3-dimensional multiple-faced lead frame.

FIG. 1 depicts an LED light source 100 having a 3-dimensional lead frame with multiple facets or faces to house multiple LED chips. A 3 dimensional lead frame 101 is provided with a shaft 102 and a standard screw thread 103. With the thread, the light source can be twisted into a traditional light socket to replace prior art incandescent bulbs. Faces or facets 104 are provided on the lead frame 101. The lead frame 101 itself acts as cathode for the LED 100. A cap 105 of the anode is provided with an extended pin 106. The cathode and anode are isolated by an insulation layer 107. The LED chip(s) 108 are placed on each facet of the lead frame 101. One or more chips per facet or face can be used. A wire 109 connects the anode of the chip 108 to the anode 105 of the lead frame and wire 110 connects the cathode of the chip to the main body of the lead frame. The lead frame with chips is covered by an epoxy cap 120. The epoxy cap 120 acts as optical lens for light emitted from chip and also as protection layer for the chip and lead frame. The overall design achieves the following features for a light source: emission of light in an arc of 360 degrees; the light source is easily replaceable, and the light source is completely sealed and water proof.

Figure 2:
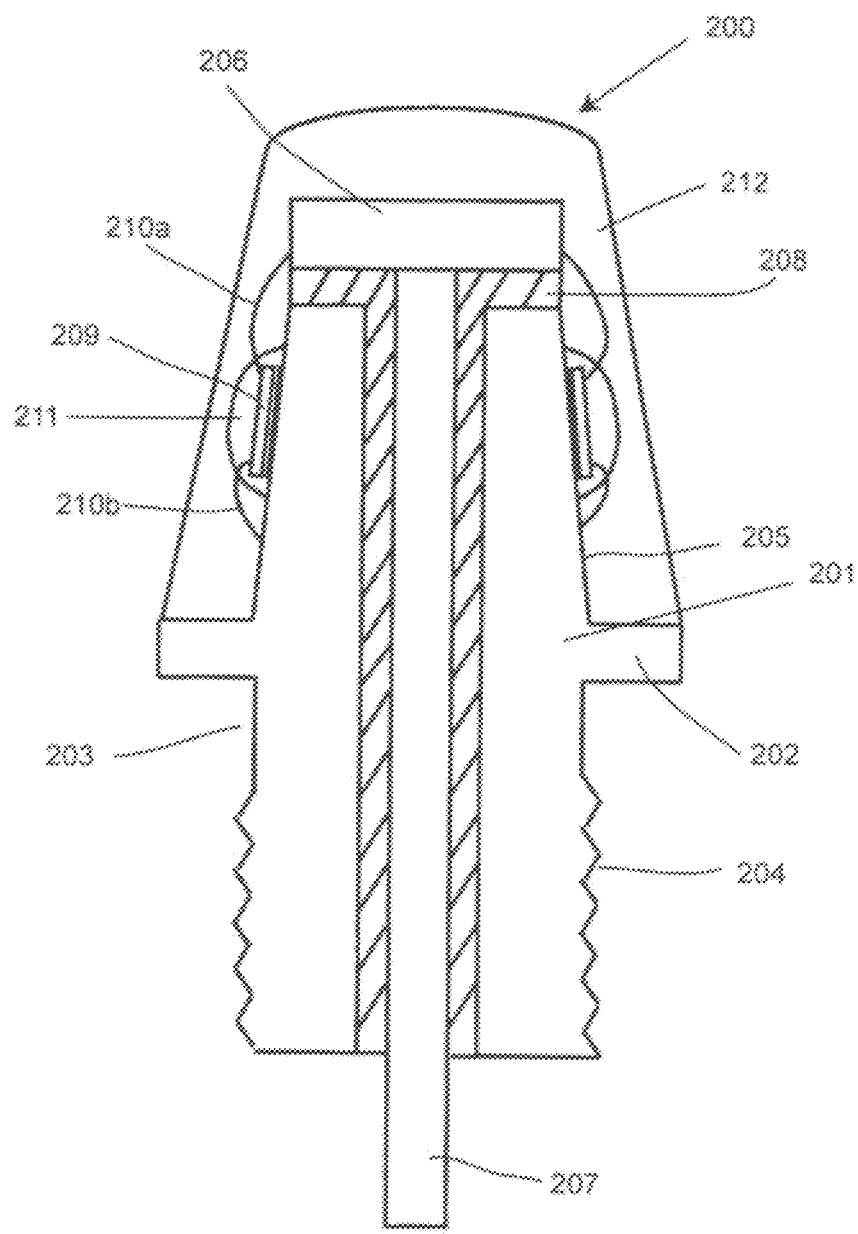
FIG. 2 depicts a cross-sectional view of the device of FIG. 1.

FIG. 2 depicts cross section 200 of the LED described in FIG. 1. Lead frame 201 is shown in cross section. Base 202 is the cathode of the LED, and the shaft 203 of the cathode connects to a threaded fitting 204. The facet portion 205 of the cathode is almost perpendicular to the base 202 in this example. Based on design requirements, the facet may not be perpendicular to the base. Cap 206 of the anode of the lead frame has a pin 207 extending through cathode of lead frame. The anode and cathode are isolated by an insulation material 208. The insulation material can be epoxy, AlO, and any other materials having insulation properties. The insulation layer will electrically insulate the anode and cathode. Chips such as 209 are attached to facets of the lead frame. Chip 209 is connected to anode 206 using wire 210 a and is connected to cathode 201 using gold or Al wire 210 b. There is a light conversion layer 211 coated on top of chip 209 to convert the emitted from the chip into different color when such conversion is required. The lead frame, anode, cathode and chips are covered by an epoxy cap 212. The epoxy cap 212 acts as both optical lens and also as a protection layer for lead frame and chips.

Figure 3:
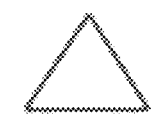
FIG. 3 depicts some example shapes for lead frame.
Figure 3:
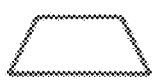
Figure 3:
Figure 3:
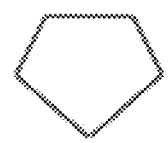
Figure 3:
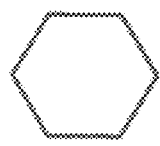
Figure 3:
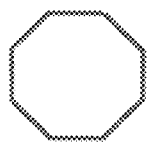
Figure 4:
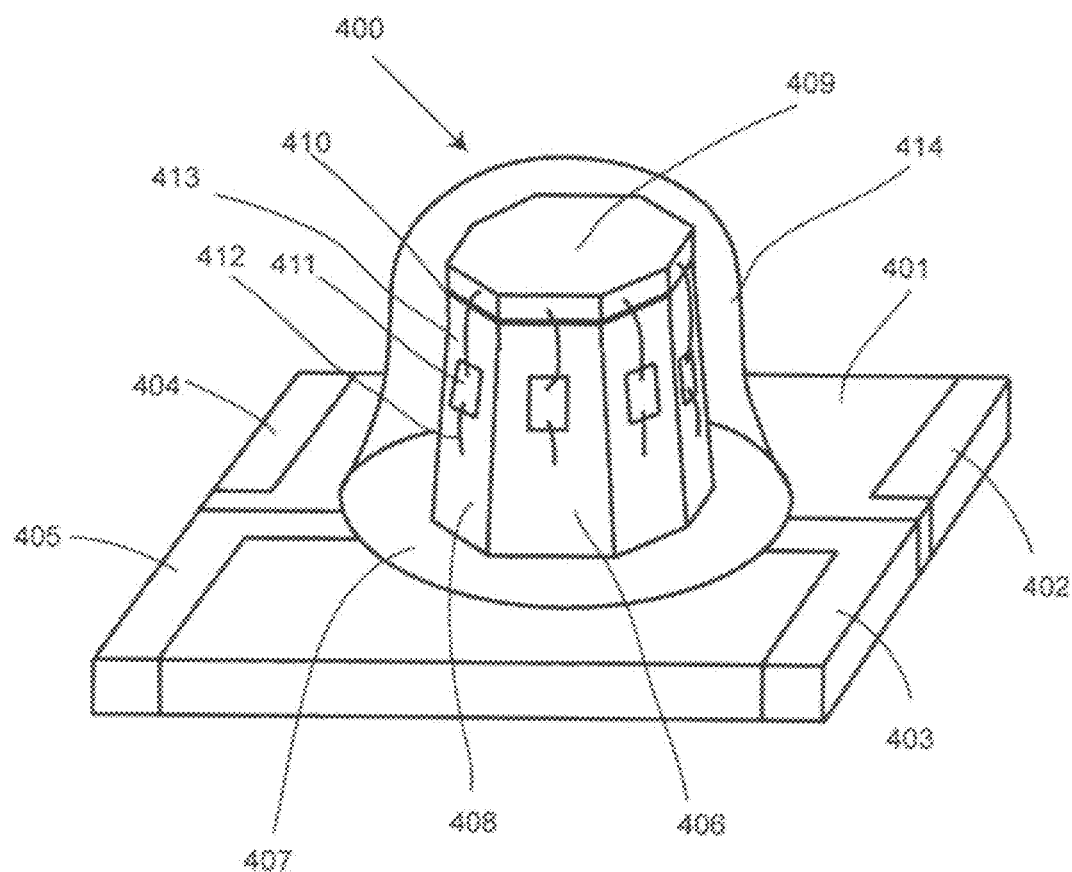
FIG. 4 depicts a perspective view of an alternative light source using a 3-dimensional multiple-faced lead frame.

FIGS. 3 a-3 f depict example profiles for a lead frame. The main shape of the lead frame is defined by the shape of cathode. The anode has the same shape as cathode and both can be any shape as desired. FIG. 4 depicts a multiple facet LED with a surface mount type package 400. A base 401 is provided that acts as a heat conductor. It can be made from electrically insulating material, such as ceramics, plastics, etc. On the base 401, electrodes 402 and 403 are laid on one side of the base and electrodes 404 and 405 are laid on the other side the base. Anodes 402 and 404 are also provided to complete the circuit with cathodes 403 and 405. Electrodes may be made by coating a metal layer like Al or Au or other alloys on top of a ceramic base. On top of the 401 base, there sits a cathode 407 of lead frame 406. The cathode 407 of lead frame 406 is connected to base 401. There are multiple vertical facets 408 connected to base 407. The anode cap 409 is placed on top of the cathode lead frame with an insulation layer 410 in between. A chip 411 is laid on one of the facets. The chip 411 is connected to cathode and anode through wires 412 and 413. The lead frame and chips are capped with epoxy layer 414, which will serve as a cap and also as an optical lens. Options include a surface mount type as well as a printed circuit board with various electronics.

Figure 5:
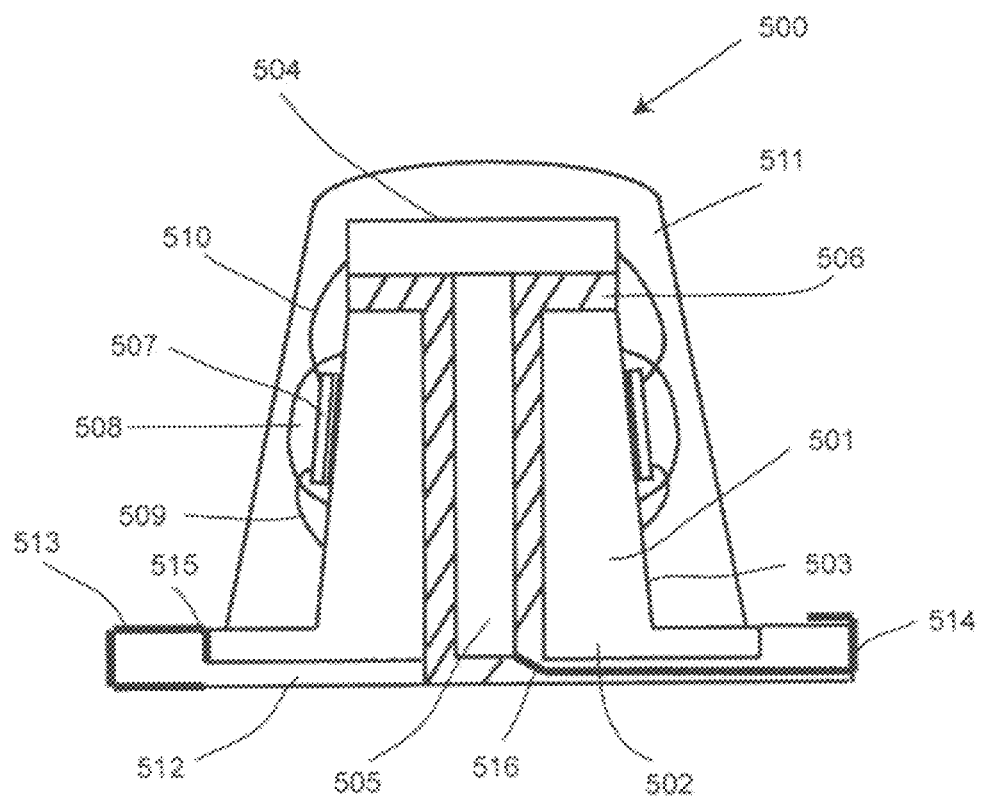
FIG. 5 depicts a cross-sectional view of the device of FIG. 4.

FIG. 5 depicts a cross-sectional view of an LED 500 such as that already discussed with respect to FIG. 4. A lead frame cathode 501 is provided with a base 502. A cap 504 is provided as well as an anode pin 505. An insulation layer 506 is located between the cathode and anode. An LED chip 507 is located on one of the frame faces such as 503. An optional phosphor coating layer 508 may be used for light color conversion. Wires 509 and 510 connect the chip to anode and cathode. An epoxy cap 511 covers the whole lead frame. The base profile of the LED is shown at 512. The material for base 512 has a property for heat conduction and electrical insulation. Electrodes are laid using metal coating layers 513 and 514 for cathode and anode, respectively. The cathode 503 of the lead frame is connected to cathode 513 in the base through connection 515 and anode 505 of the lead frame is connected to anode in the base 514 through connection 516.

Figure 6:
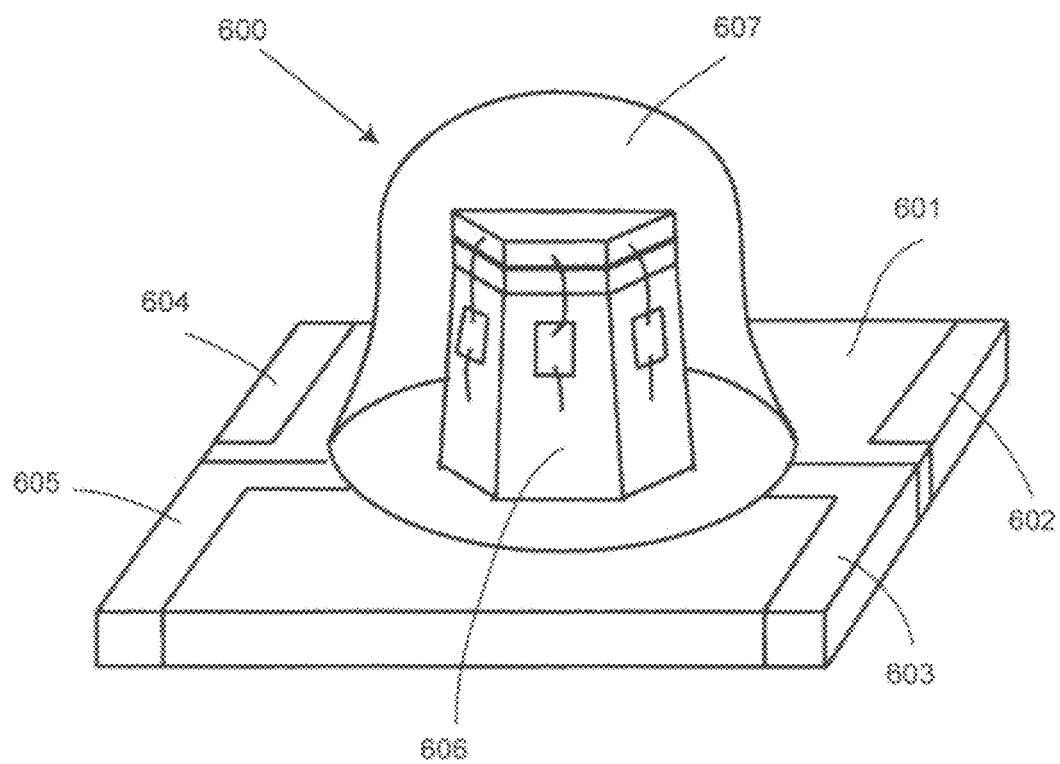
FIG. 6 depicts a perspective view of another alternative light source using a 3-dimensional multiple-faced lead frame.

FIG. 6 depicts another packaging style with light only emitted in one direction. Note the fewer faces on the frame. The LED 600 has a base 601 and electrodes 602, 603, 604, and 605 respectively. The lead frame 606 only has multiple facets in one direction and chips are placed on the facet. There is an epoxy cap 607 to protect the lead frame and LED chips. The light will be emitted in one direction. Such light can be used for different backlighting applications.

Figure 7:
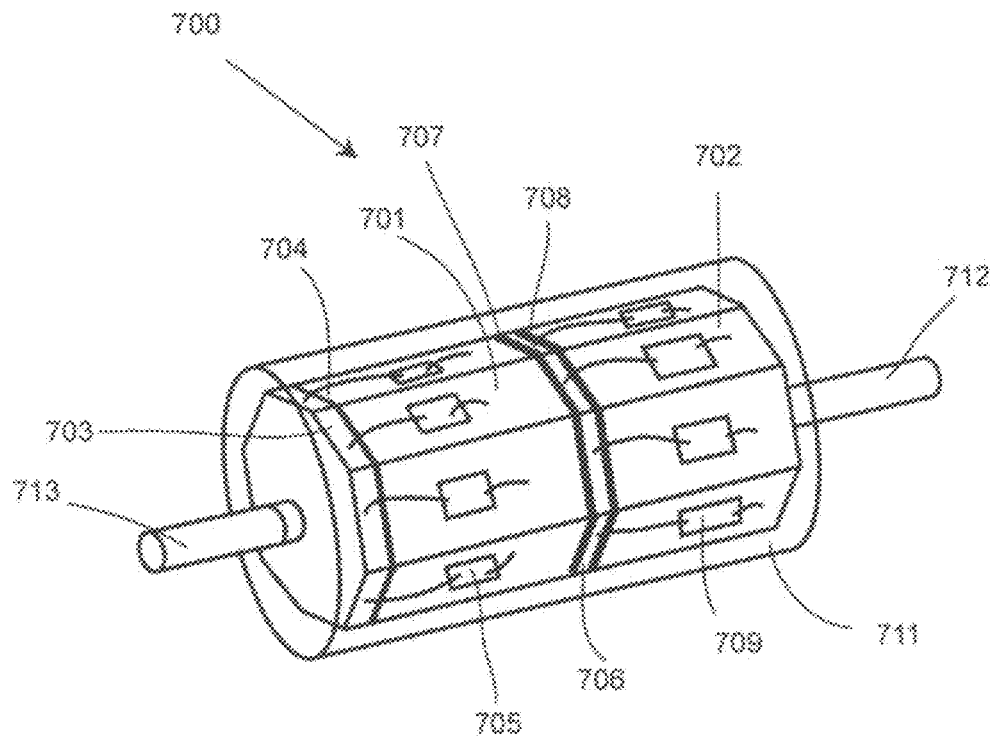
FIG. 7 depicts a perspective view of another alternative light source using a 3-dimensional multiple-faced lead frame.

FIG. 7 depicts a cylinder style of two multiple face lead frames connected to each other. LED 700 has two cathode lead frames 701 and 702 with multiple facets. One anode 703 is placed to next to cathode 701 with insulation layer 704. A chip 705 is placed on one of facets with wire connections to anode and cathode. Another anode 706 which is sandwiched by two insulation layers 708 and 709 is placed between frames 701 and 702. LED chip 709 is placed on top of one of faces in 702. An epoxy cap 711 is molded to cover the whole lead frame and components. Electrodes 712 and 713 are set up as the leads for anode and cathode, respectively.

Figure 8:
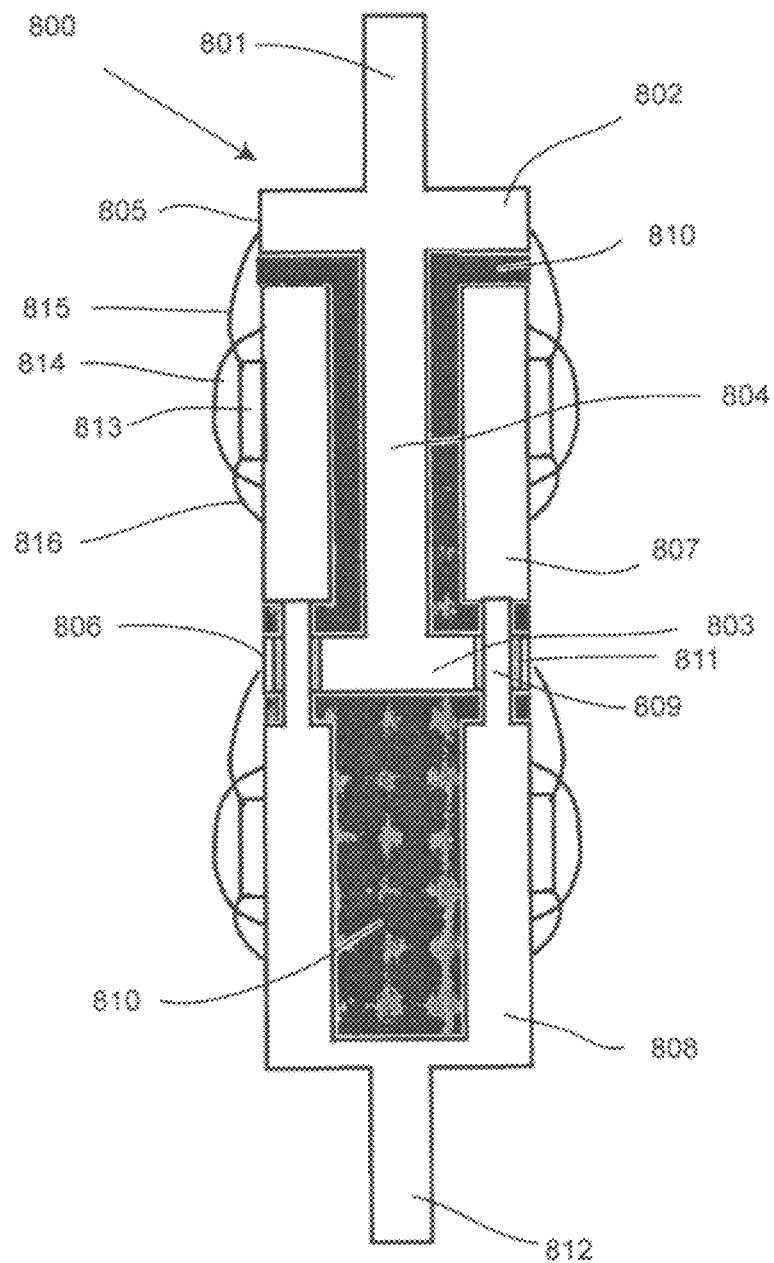
FIG. 8 depicts a cross-sectional view of the device of FIG. 7.

FIG. 8 depicts a cross sectional view of the LED illustrated in FIG. 7. This view shows the arrangement between anode and cathode. In the anode, there is a contact 801. Platforms 802 and 803 connected by a rod 804. There are two bonding facets 805 and 806 on platforms 802 and 803, respectively. Two cathodes 807 and 808 with multiple facets are connected through connection rod 809. Insulation layers 810 and 811 are used to fill the space between anode and cathode. The contact for cathode is 812. A chip 813 is mounted on a facet of the lead frame. An optional phosphor coating 814 can provide wavelength conversion. Wires 815 and 816 connect the chip to anode and cathode.

A light source with a multiple faceted lead frame with LED chip(s) attached to each facet can be provided to integrate multiple chip(s) into one small foot print package. The number of facets on the lead frame can be one to infinity depending on requirements. The lead frame is a 3-dimensional device with facets angled in desired directions. Cathode and anode of the lead frame isolated with insulation materials. One or more LED chips can be attached to each facet. A light conversion layer may be coated on top of LED chips to convert the color of the light emitted by the chips. The lead frame is covered by an epoxy capsule as both protection and optical lens. The lead frame can be a diode type with a thread on the base or surface mount type with electrodes on the base. The multiple faceted lead frame can be one section or multiple sections to form a bar type of light source. A white light source with multiple facet lead frame by applying a phosphor on top of a blue chip. The lead frame is made from a heat conducting material in order to draw heat away from the chips and avoid loss of lumen output due to heat effect.

While the present invention has been described and illustrated in conjunction with a number of specific embodiments, those skilled in the art will appreciate that variations and modifications may be made without departing from the principles of the invention as herein illustrated, described, and claimed. The present invention may be embodied in other specific forms without departing from its spirit or essential characteristics. The described embodiments are to be considered in all respects as only illustrative, and not restrictive. All changes which come within the meaning and range of equivalency of the claims are to be embraced within their scope.

What is claimed is:

1. A light source, comprising:
   a base;
   a faceted portion arranged on the base, and comprising a bottom width and a plurality of facets;
   a hollow passageway surrounded by the plurality of facets, and comprising a top opening and a bottom opening;
   a pin passing through the hollow passageway from the top opening to the bottom opening;
   an electric insulator arranged between the pin and the faceted portion;
   a shaft arranged under the base and having a top width substantially equal to the bottom width in a cross-sectional view; and
   a plurality of LED chips arranged on the plurality of facets and electrically connected to the pin.

2. The light source of claim 1, wherein each facet of the plurality of facets has at least one LED chip positioned thereon.

3. The light source of claim 1, wherein at least one LED chip of the plurality of LED chips is covered with a light conversion layer.

4. The light source of claim 3, wherein each LED chip of the plurality of LED chips is covered with a light conversion layer.

5. The light source of claim 4, wherein the light conversion layer comprises a phosphorous material.

6. The light source of claim 1, wherein at least one of the plurality of facets has an orientation not parallel to the base.

7. The light source of claim 1, further comprising a transparent cap sealing the plurality of LED chips and the faceted portion.

8. The light source of claim 1, wherein the electric insulator has a portion arranged on the top opening.

9. A light source, comprising:
   a base;
   a faceted portion arranged on the base, and comprising a bottom width and a plurality of facets;
   a hollow passageway surrounded by the plurality of facets, and comprising a top opening and a bottom opening;

a pin passing through the hollow passageway from the top opening to the bottom opening;

an electric insulator arranged between the pin and the faceted portion;

a shaft arranged under the base and having a top width substantially equal to the bottom width in a cross-sectional view; and a plurality of LED chips electrically connected to the pin, each LED chip covered by a light conversion layer, the plurality of LED chips arranged on each respective facet of the plurality of facets to provide an emission of light in an arc of 360 degrees.

10. The light source of claim 9, wherein the light conversion layer comprises a phosphorous material.

11. The light source of claim 9, wherein the electric insulator has a portion arranged on the top opening.

12. The light source of claim 9, wherein the electric insulator has a surface coplanar with an outer surface of the faceted portion.

13. The light source of claim 1, wherein the electric insulator has a surface coplanar with an outer surface of the faceted portion.

\* \* \* \* \*